(12) United States Patent
Baier

(10) Patent No.: US 7,652,230 B2
(45) Date of Patent: Jan. 26, 2010

(54) OPERATING DEVICE FOR AN ELECTRICAL APPLIANCE HAVING A CONTROL PANEL AND SUBADJACENT SENSOR ELEMENT AND METHOD OF OPERATING SUCH AN OPERATING DEVICE

(75) Inventor: Martin Baier, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 466 days.

(21) Appl. No.: 11/461,644

(22) Filed: Aug. 1, 2006

(65) Prior Publication Data

US 2007/0045281 A1    Mar. 1, 2007

Related U.S. Application Data

(63) Continuation of application No. PCT/EP2005/000706, filed on Jan. 25, 2005.

(30) Foreign Application Priority Data

Feb. 2, 2004    (DE) ........................ 10 2004 005 952

(51) Int. Cl.
*H05B 1/02*    (2006.01)
(52) U.S. Cl. ...................... 219/483; 219/494; 219/506; 219/508; 324/716
(58) Field of Classification Search ......... 219/483–487, 219/497, 506–510, 494; 324/699, 716
See application file for complete search history.

(56) References Cited

U.S. PATENT DOCUMENTS

| | | | |
|---|---|---|---|
| 3,643,041 A | 2/1972 | Jackson | |
| 4,090,092 A | 5/1978 | Serrano | |
| 4,158,216 A | 6/1979 | Bigelow | |
| 4,228,330 A | 10/1980 | Larson | |
| 4,359,720 A | 11/1982 | Chai et al. | |
| 4,876,461 A | 10/1989 | Gratke | |
| 5,053,585 A | 10/1991 | Yaniger | |
| 5,155,338 A | 10/1992 | Hoffmann | |
| 5,159,159 A | 10/1992 | Asher | |
| 5,499,041 A | 3/1996 | Brandenburg et al. | |
| 5,572,205 A | 11/1996 | Caldwell et al. | |
| 5,719,740 A | 2/1998 | Hayashi et al. | |

(Continued)

FOREIGN PATENT DOCUMENTS

DE      3446327      6/1986

(Continued)

OTHER PUBLICATIONS

Chinese Office Action for Chinese Application No. 200580003836.6.

(Continued)

*Primary Examiner*—Mark H Paschall
(74) *Attorney, Agent, or Firm*—Alston & Bird LLP

(57) ABSTRACT

An operating device for a cooktop has a cover with a control panel with a plurality of operating areas. Below the panel, several FSR sensors are positioned. When a control panel is pushed down by a process of operation, the FSR sensor changes its electrical resistance resulting in change of a signals that can be detected and interpreted as operation of the appliance by a user.

20 Claims, 2 Drawing Sheets

U.S. PATENT DOCUMENTS

| | | | |
|---|---|---|---|
| 5,721,666 | A | 2/1998 | Girard |
| 5,856,646 | A | 1/1999 | Simon |
| 5,869,791 | A | 2/1999 | Young |
| 5,917,165 | A | 6/1999 | Platt et al. |
| 5,923,522 | A | 7/1999 | Sajna |
| 5,995,877 | A | 11/1999 | Brueggemann et al. |
| 6,137,072 | A | 10/2000 | Martter et al. |
| 6,376,809 | B1 | 4/2002 | Huber et al. |
| 6,429,668 | B1 | 8/2002 | Billen et al. |
| 7,113,179 | B2 * | 9/2006 | Baker et al. ............ 345/178 |
| 2005/0057529 | A1 | 3/2005 | Mairal Serrano |

FOREIGN PATENT DOCUMENTS

| | | |
|---|---|---|
| DE | 19811372 | 9/1999 |
| DE | 10103563 A1 | 8/2002 |
| DE | 10201196 | 7/2003 |
| DE | 10203114 | 7/2003 |
| EP | 0 225 748 A2 | 6/1987 |
| EP | 0578019 A2 | 1/1994 |
| GB | 2022872 A | 12/1979 |
| WO | WO 86/06544 | 11/1986 |
| WO | WO 97/11473 | 3/1997 |
| WO | WO 01/85292 A1 | 11/2001 |
| WO | WO 03/025961 A1 | 3/2003 |

OTHER PUBLICATIONS

International Search Report from PCT/EP2005/000706 dated Mar. 22, 2005.

German Search Report fro German Application No. 10 2004 002 825.7, dated Oct. 14, 2004.

International Search Report from PCT/EP2005/000186 dated Jun. 28, 2005.

File History for U.S. Appl. No. 11/456,749, retrieved from PAIR on May 29, 2009.

Machine Translation of Specification of DE102004005952, produced on Mar. 11, 2009.

Machine Translation of W02005073634, downloaded from htto://epo.worldlingo.com on Mar. 12, 2009, European Patent Office.

German Search Report from German Application No. 10 2004 005 952.7, dated Apr. 29, 2005.

* cited by examiner

OPERATING DEVICE FOR AN ELECTRICAL APPLIANCE HAVING A CONTROL PANEL AND SUBADJACENT SENSOR ELEMENT AND METHOD OF OPERATING SUCH AN OPERATING DEVICE

CROSS REFERENCE TO RELATED APPLICATIONS

This application claims priority from PCT application no. PCT/EP2005/000706, filed Jan. 25, 2005, which is based on German Application No. 102004005952.7, which was filed Feb. 2, 2004, of which the contents of both are hereby incorporated by reference.

FIELD OF THE INVENTION

The invention relates to an operating device for an electrical appliance, preferably a domestic appliance, as well as to a method for evaluating/operating such an operating device.

BACKGROUND

It is for example known from the prior art of DE-A-19645678 or DE-A-19811372 to provide for an electrical appliance or domestic appliance an operating panel below which is positioned at a specific location forming a so-called operating field, a pressure-sensitive piezoelectric element. If pressure is applied to the cover, which can be made from thin high-grade steel or aluminum, this pressing action can be evaluated as a desired operation by the piezoelectric element. An associated evaluation or control circuit supplies a signal to the electrical appliance. It is considered disadvantageous in this situation, because the use of piezoelectric elements leads to certain disadvantages, particularly in view of the fact that they are in part mechanically fault-prone and cannot be easily installed into an appliance. It is often frequently necessary to use special manufactures or special components of piezoelectric elements, which have a negative influence on expenditure, particularly manufacturing costs and availability at short notice. The use of other sensor elements such as capacitive or optical sensor elements suffers from the disadvantage that they cannot, or can only with very considerable expenditure, be used behind metallic operating panels or for an optical system optical transparency is vital.

BRIEF DESCRIPTION OF THE DRAWINGS

The invention is described in greater detail hereinafter relative to the attached diagrammatic drawings, in which.

DETAILED DESCRIPTION OF THE EMBODIMENTS

Figure 1:
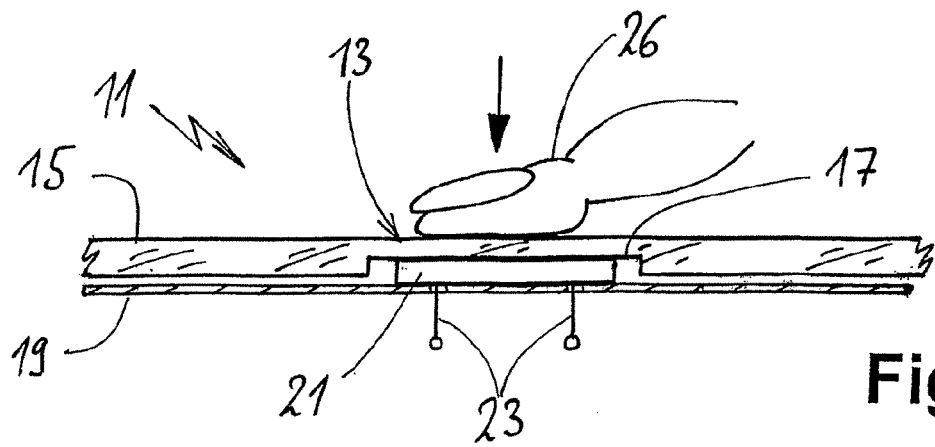
FIG. 1 illustrates a cross-section through an operating device according to the invention with FSR sensor.

One problem solved by the invention is to provide an operating device and a method similar to the aforementioned type with which it is possible to avoid the prior art disadvantages and, in particular, permit the use of an operating device which can be constructed from preferably standard components and limited manufacturing costs.

This problem is solved by an operating device having the features of claim 1 and a method for evaluating the output of such an operating device with the features of claim 12. Advantageous and preferred developments of the invention form the subject matter of the further claims and are explained in greater detail hereinafter. By express reference the wording of the claims is made into part of the content of the description.

According to one embodiment of the invention, operation takes place by the application of pressure on an operating field, for example by the application of a finger with a certain pressure. The operating field (e.g., an area to which the user's finger is applied to on a cover or plate) is variably shaped and capable of deflection, so that it can deflect downwards in a certain operating path. Beneath the operating field is provided a pressure-sensitive sensor element, which detects the pressure or movement when pressed. The resulting signal is evaluated as a possible input for operating the appliance. According to the invention, the sensor element is constituted by a force sensing resistor ("FSR") sensor and which in particular has a variable electrical resistance. In a particularly advantageous manner, the electrical resistance of the FSR decreases with increasing pressure applied to the operating field, as explained in greater detail hereinafter.

Thus, the movement of the operating field due to pressure exerted by the operator's finger results in acting on the FSR sensor, and is converted into an electrical signal generated by the sensor, or results in a changing a signal applied to the sensor. The signal, in turn, can be evaluated by a corresponding control circuit, or the like, as indicating an operational input by the user for controlling the appliance.

One major advantage of such an FSR sensor is that the use of complicated and mechanically sensitive piezoelectric elements can be avoided. In addition, a FSR sensor is generally made from plastic, often in film form, so that it is not very mechanically sensitive and unsusceptible to corrosion. In addition, because a FSR sensor can be made very thin, the operating device can take be constructed in a lightweight, space-saving manner. Furthermore, because an FSR sensor is usually made of synthetic material, especially in the form of film, it is less delicate in the mechanical sense and is not susceptible to corrosion, moisture in particular, such as the condensation that may occur when used in washing machines. Moreover, this type of FSR sensor can be produced in a very thin manner so that, due to its installation height, the control device can be easily and space-savingly assembled It is possible for the control pad to make up part of an access cover or control cover, which can extend across a large or much larger area of an electric appliance. For example, the cover may be part of the frame of a stove top or preferably a control cover or panel of a washing machine or dryer. The control pad, access cover or control cover may be a uninterrupted smooth surface and not allowing for interruptions. This kind of closed construction should achieve an attractive design as well as water resistance.

It is beneficial for the control pad, corresponding access cover or control cover, to be made thinner or of an elastic material in an area above the sensor element. For instance, access covers, control panels, or control covers, which are designed to offer a mechanical stability and therewith prevent bending as much as possible, should be capable of deflection or pliability in the area of the control pad or on the sensor elements when depressed by a user. These kinds of thinner designs can, for example, be achieved by machining, stamping, other means of thinning the material on the inner or back side of a control pad.

One possibility for the design of a control pad, control cover or access cover is to make it out of thin metal. Here metal foils can be used. They are especially favorable due to their resistance to mechanical interference and contamination. Good materials are stainless steel or aluminum. Still, synthetic material is preferred for use, mainly because it is more elastic and a bigger or lighter deflection as a control path is made possible.

It is possible to further design the invention so that the sensor element is connected to the control pad by connecting element, that is to say, that it is coupled to it. At this point it is beneficial to plan for a positive locking connection which runs along the back side of the control pad. This connecting element can activate the operation or effect of pressure on the FSR sensor in a punctiform manner or in a smaller area, for example, in the space of a few millimeters. In this case, the change in resistance is bigger although the amount of force exerted remains the same.

In one sample design of the inventions several FSR sensors for several control pads or for control elements consisting of the control pads can be planned for. In this case the sensors are contiguously arranged or form a physical unit. Additionally, they are especially good for having mechanically connected, yet electrically separated supply lines. These can lead to a shared connection area, at which point an electric contact via plugs or some other contact system is possible.

It is especially advantageous that one of the two electrical connections to each of the FSR sensors is set to take place via its own separate supply line. The other electrical connection can take place via a shared return line, for example, a sort of shared, body contact.

A conductor can be allowed for underneath the control pad in additional design versions of the invention. The FSR sensor is located here and supported in such a prime position across from the control pad that the operational power does affect the FSR sensor, but still does not deflect the conductor. It can be planned so that an electrical contact or supply lines, designated for the activation or evaluation. are located on the conductor. The conductor can also act as a control or something comparable, intended for the FSR sensor, and, for instance, for the entire electric appliance.

In advantageous construction of the invention the control mechanism not only consists of just a single control pad, but rather several control pads for various functions or separate function modes of the electrical appliance. It is best if these control pads are located in groups or next to each other in a control area.

It is especially preferable to design a one piece, integrated cover inside of which the control pads are intended to be and, which also, among other things, form the control area. This provides the advantage that time and effort remain minimal and it can be ensured that the cover is waterproof and the like. It is possible to create a sort of tree shaped FSR sensor device with electrical supply lines run along its branches to each individual FSR sensor and these sensors are each conveniently located at the respective ends.

Fortunately, it is also possible to construct a cover like the one for the FSR sensor which is separate and easily removable. This means that on the one hand, particularly on a prescribed conductor, one or several FSR sensors including activation and evaluation can be built. A cover, which can be design in various versions depending on the design stipulations of different producers or on what it will be used for. This is especially advantageous when using covers made of metal or similar material.

As an alternative it is possible to affix an FSR sensor itself to the cover or to create a physical unit with it. The side upon which the operation pressure should work can then be planned for location on the side facing away from the cover. This way, the FSR sensor itself with be pressed against a conductor or something like it upon operations. Pre-packaging with a complete connection to a control or evaluation is only possible when these are located on the cover.

A control pad can be designed to that only slight pressure is required for operation via the FSR sensor. Deflection can as little as 10 $\mu m$(micrometers), or 50 or 100 $\mu m$, for instance 20 $\mu m$ to 40 $\mu m$. The resistance of the FSR sensor as a function of the deflection can be detected by a controller as a sort of resistance or threshold value. Only once this value has been reached or surpassed, a controller can interpret it as a deliberate and intended operation by a user, which then leads to the corresponding triggering as a operational process. A deflection of this small amount may be almost undetectable for a user. Yet this may still be desired since the operational performance that results is like optical or capacitive touch switches without having to take their aforementioned disadvantages into account. A requisite depression force for normal operation may require, for example, a few Newtons, which could lead to the aforementioned deflection when using the cover, oriface plates, or control pad.

It is possible to design the invention so that during its standard evaluation of the control device the FSR sensor is pressed first when pressure is applied to the control area. After it is released it resets itself. These processes send signal or rather, create a signal distribution that is characteristic of basic distribution. These signals or signal distribution are then considered solely as operation as long as they remain within the preset parameters. After achieving the maximum necessary signal by pressing for a certain amount of time, for instance, for more than a half or a full second, it is particularly feasible to value the action as operation when dealing with a simply constructed version of the invention.

With a different version, especially when it consists of a different operation process and a more secure way of being operated, it can be designed so that one has to wait for the signal reset itself. A certain amount of time must lapse between when pressure is signaled and when the resetting takes place. This should take less than 5 seconds, preferably less than 2. This means that when an operator presses on the control pad and instinctively or automatically lets go right after, the action will be interpreted as being an operational process. The action will not be recognized at all if the pressure is held much shorter or much longer.

The FSR sensor is then, so to speak, not used as an active, rather as a passive sensor in a standard process of the invention. It changes its electrical resistance when operated. This is calculated by a resistance measurement, which can basically take place at any given time. An Sensor is especially preferred when it is constructed so that it changes the resistance by a ratio of at least 10 when on the control path in the aforementioned area, especially at about 20 $\mu m$ (micrometers).

Control device and its process are beneficial for electrical household appliances such as a cooking range, an oven or for so-called machines of the white linen industry like washing machines and dryers as well as dishwashers and microwaves or similar items. These are good for featuring oriface plates made of synthetic materials.

These and other characteristics of preferred further development of the invention, aside from being based on demands, emanate from the description and sketches and now require protection. However, the individual characteristics, each for itself or several together in combination as the embodiment of the invention and in other areas yet to be realized and beneficial as well as protectable versions for themselves to be able to represent, for them protection is now required. The subdivision of the registration into individual sections as well as with subheadings do not pose limitation to the statements made in their overall validity.

These and further features of preferred embodiments of the invention can be gathered from the claims, description and drawings and the individual features, both singly and in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

Turning now to the Figures, FIG. 1 shows in section an operating device 11 according to the invention. It has an operating field or control pad 13 formed on a cover 15 and representing the surface area or portion on which a finger 26 can be applied for operating purposes. Below the operating field the cover has a recess 17 formed by thinning the material comprising the cover 15. This ensures that at least in the vicinity of the operating field 13 a standard pressure as a result of an operating process or the application of the finger 26 gives rise to a downward deflection of the operating field of the necessary amount.

Underneath the cover 15 runs a conductor 19 parallel to the cover. An FSR sensor 21 is located on it and is position in the area of the cut-out 17 and directly on the bottom side of the cover 15 in the control pad's area 13. The sensor can also be glued on to the cover. The conductor 19 can be any kind of conductor through which the electrical connections 23 of the FSR sensors 21 run, or along which the conductors can be installed. Otherwise the conductor 19 could be a printed circuit board with circuit paths or traces upon which connections 23 are soldered or otherwise connected to it, as is usual with electrical components. The conductor should be able to withstand the pressure that operation activates.

If a finger 26 presses on the control pad 13 with a usual operational force, for instance, somewhere near a force of 2 Newtons, the control pad 13 deflects, whether it is due to the material or cut-out 17. This amount of deflection occurring is very little, for example, between 10 and 40 µm. This deflection transfers directly to the FSR sensor 21. The sensor is then pushed upon and the higher the pressure exerted on the sensor, the less the resistance of the FSR sensor 21. Usually there is no correlation between pressure or deflection and the change in electrical resistance. However, a relatively exact allocation between certain pressure and the resulting electrical resistance can be observed. The response curve usually runs somewhat exponentially.

The resistance of the FSR sensor 21 in a non-operational mode is usually at more than 20 MOhm. At maximum pressure, the FSR sensor can reach around a few kOhm. The specific values is, of course, dependent on its construction and the conductive materials used.

Figure 2:
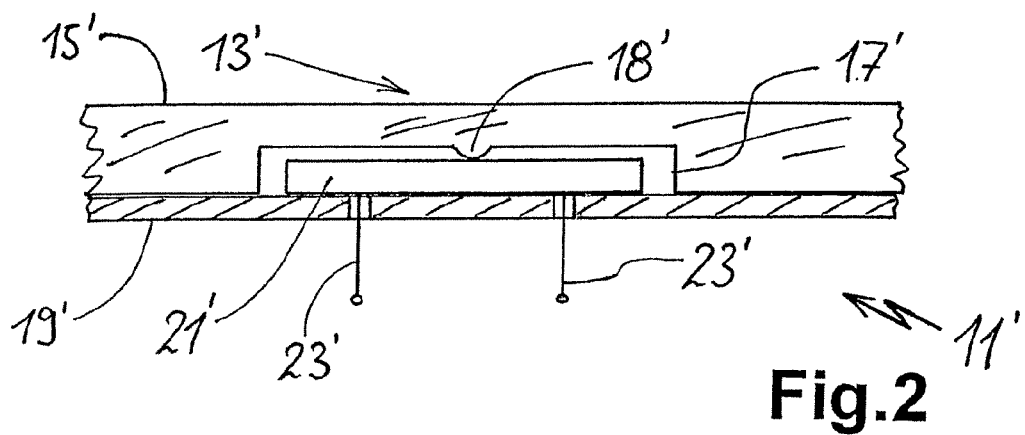
FIG. 2 illustrates another embodiment of the invention.

FIG. 2 shows a device 11' which is a modification of the control device 11 and similar to that in FIG. 1. In the under side of the cover 15' near the cut-out area 17' and underneath the control pad 13' there is a protrusion 18'. Typically, it is formed from the same material as the cover so that it is a single piece. The protrusion 18' produces a substantially punctiform pressure, or rather a concentration of pressure, focused on a smaller area of the FSR sensor 21' as a result of the operation. Thus, the resistance changes faster and the FSR sensor 21' responds faster to an detectable level.

Figure 3:
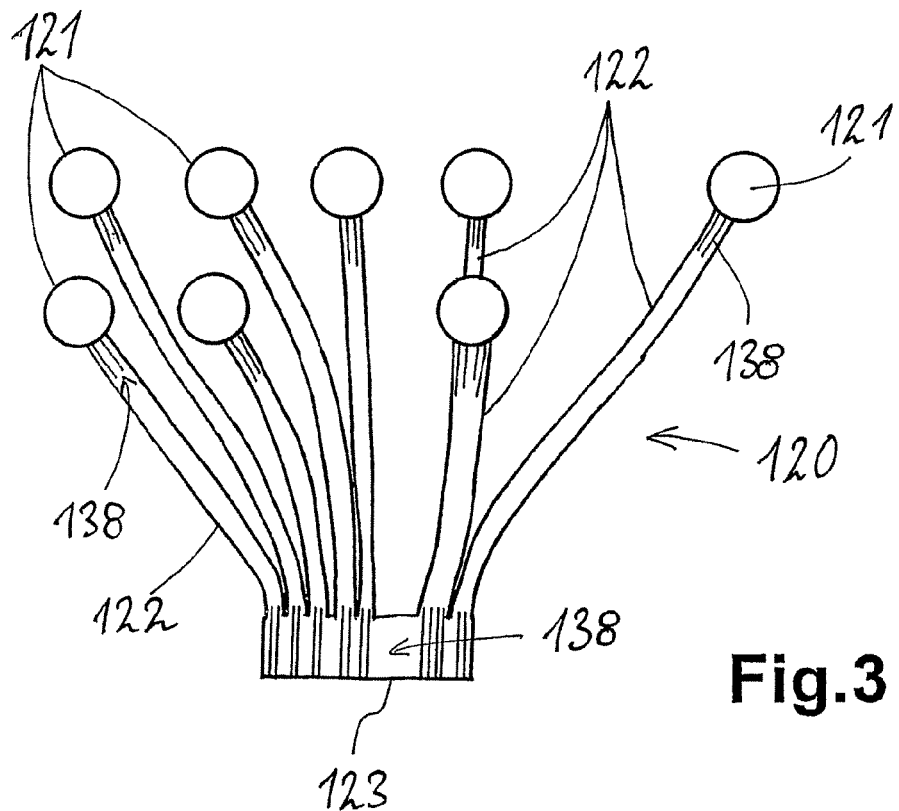
FIG. 3 illustrates another embodiment of the sensor configuration with a plurality of FSR sensors extending in a tree formation.

In FIG. 3 a tree-like sensor configuration 120 is portrayed. It is formed as a single piece and features a multitude of FSR sensors 121. Thus, with this kind of sensor configuration 120, a control device with a corresponding number of control pads 13 can be created.

The FSR sensors 121 are configured at the end of the supply lines 122. Upon the supply lines 122, which lead to a connector panel, 123 run the electrodes 138, thereby forming connection lines in this area. The electrodes 138 are denoted by the bars on the supply lines 22. On the connector panel 123, the electrodes can correspond with the electric connections 23 in accordance with FIG. 1 to form a sort of contact bay. A connection can take place via corresponding constructions, for example, an overlying contact binder or something similar.

The advantage of a sensor configuration 120 in accordance with FIG. 3 is the fact that it is a single piece that simplifies application and installation as well as the connections to it. Instead of a tree-like, tangled layout, it is also possible to either supplimentarily superimpose this to another area-measured supporting layer, which can be angular in form. Alternatively, one of the support foils or even both, can feature a corresponding area-measured run.

Figure 4:
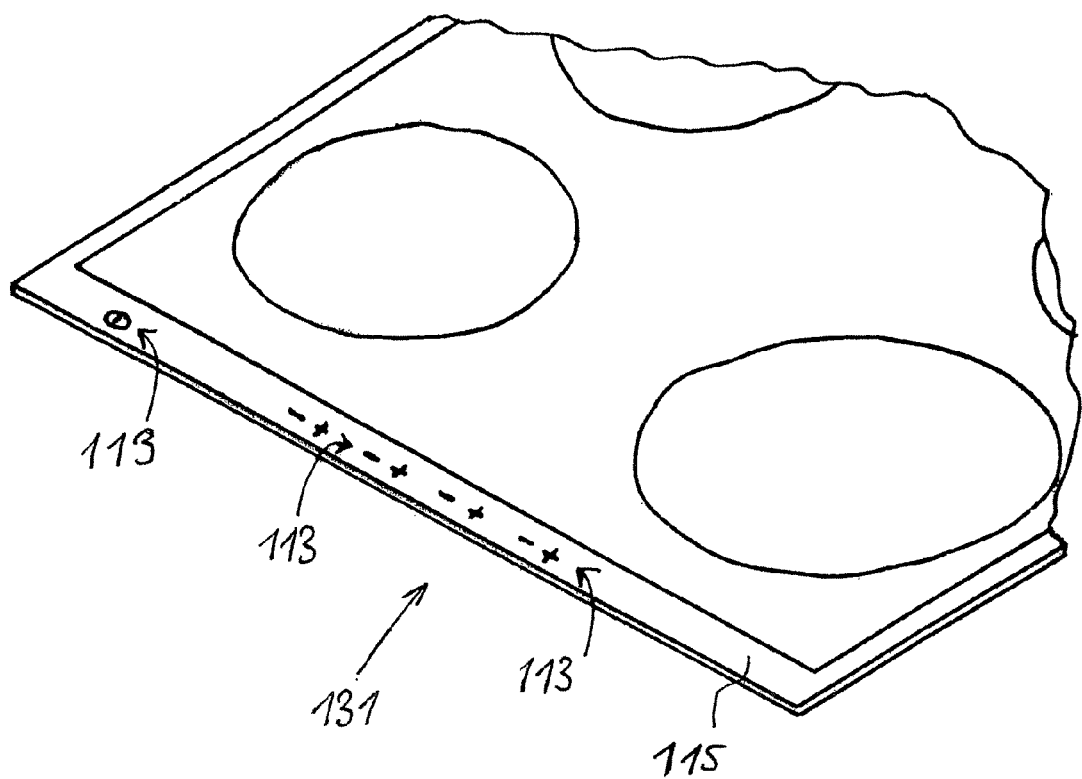
FIG. 4 illustrates a one embodiment of a cook top in which the control device is integrated into the frame.

A cook top 131 is depicted in FIG. 4 which is a so-called glass-ceramic cook top. This features a cook top frame 115 that runs around its perimeter and the controls are formed on the left lower side rather than to the operator to the front side. The frame 115 features various control pads 113 including one to the far left in the form of an ON-/OFF switch, as well as like in the middle section as a switch for the power settings for the individual cooking burners which are depicted schematically as circles. By applying pressure to the control pads 113 the respective, dedicated functions can be activated. In the construction underneath the cooking range frame 115 there is a control device similar to the one in FIG. 1. At the same time, the surface of the cooking range frame 115 or rather, the range itself can wholly be made of a metal layer, a metal plate or metal foil which corresponds to the cover 15 from FIG. 1. Since the FSR sensor 21 in accordance with FIG. 1 is only to be installed underneath the control pads 113, it is acceptable for the metal in the rest of the cooking range frame's 115 section to be considerably thicker. As an alternative to thinning out a thicker layer of metal from below, the frame can also be thinned out from the above. In this case, the valley that results from this could be used for structuring an exact location for laying a finger on it.

Figure 5:
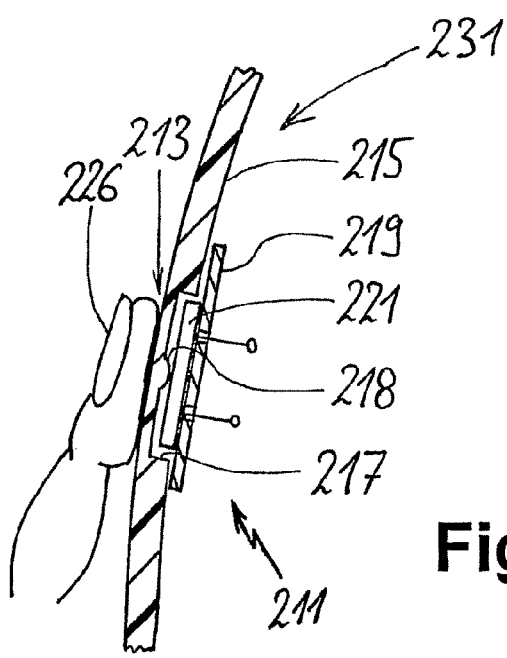
FIG. 5 illustrates the assembled FSR sensor in section showing the individual layers including a plastic panel, such as may be embodied in a dryer or other appliance.

Another embodiment of the control device invention 211 is depicted in FIG. 5. A slightly curved baffle 231 is pictured, used for a washing machine, for instance, or a dryer. The baffle 231 consists of plastic and features a cut-out 211 behind a control pad 213. Therein, similar to FIG. 2, is an FSR sensor 221 located on a conductor.

If the finger 226 presses the control pad 213, the baffle 231 then presses the section below. In the cut-out area 217 on the bottom side is the fitted protrusion 218 that presses on the FSR sensor 221 and activates a resistance change as was previously described. This can be interpreted as an operation by suitable control circuitry (not shown).

The invention claimed is:
1. An electrical appliance comprising:
   a cover formed from a sheet metal, said cover comprising a plurality of operating fields wherein each operating field comprises said sheet metal having a first thickness at said operating field and a second thickness surrounding an operating field, wherein said first thickness is thinner than said second thickness, said sheet metal being electrically conductive throughout and having a first side facing a user and a second side; and a plurality of operating devices, each comprising device comprises a pressure-sensitive sensor element incorporating an FSR sensor arranged below said operating field, wherein a user pressing on said operating field results in deflection of said operating field causing the application of pressure on said FSR sensor, thereby altering the resistance of the FSR sensor and further altering an electrical signal passing through the FSR sensor, thereby signifying operation of the electrical appliance by the user.

2. The electrical appliance according to claim 1, wherein said FSR sensor is constructed as having a variable, electrical resistance and wherein an increase of said pressure on said FSR sensor results in a decrease in said electrical resistance of said FSR sensor.

3. The electrical appliance according to claim 1, wherein said sheet metal is thinned from said second side.

4. The electrical appliance according to claim 3, wherein said cover is part of an electrical cooking appliance.

5. The electrical appliance according to claim 4, wherein said cover comprises a first area over said FSR sensor capable of said deflection more so than a second area surrounding the first area.

6. The electrical appliance according to claim 1, a wherein said plurality of operating fields are arranged in a juxtaposed form in an operating area and a one-piece, continuous cover comprising an operating area defines the plurality of operating fields.

7. The electrical appliance according to claim 1, wherein the plurality of FSR sensors are separately electrically connected to a lead device and have a common connection area.

8. The electrical appliance according to claim 7, wherein each said FSR sensor has a respective first lead device as a first electrical connection and second electrical connection as a common return.

9. The electrical appliance according to claim 1 further comprising a support positioned parallel to said cover, wherein said plurality of operating devices are located between said cover and said support.

10. The electrical appliance according to claim 1 wherein said sheet metal is designated by a marking on said first side.

11. The electrical appliance according to claim 1, wherein said FSR sensor is connected to said cover.

12. The electrical appliance according to claim 11, wherein said FSR sensor is connected to an underside of said operating field as a direct coupling.

13. The electrical appliance according to claim 11, wherein said FSR sensor is adhered to said cover.

14. The electrical appliance according to claim 1, wherein said operating device has a support below said operating field, wherein said FSR sensor is located on said support between said support and said operating field.

15. The electrical appliance according to claim 14, wherein said support has a control circuit for said operating device.

16. The electrical appliance according to claim 1, wherein an elastic deformation of said FSR sensor less than 100 μm alters an electrical signal signifying user operation of the appliance.

17. A method of operating an electrical appliance comprising a cover formed from sheet metal being electrically conductive throughout, said cover comprising an operating field having a first thickness at said operating field and a second thickness surrounding said operating field, wherein said first thickness is less than said second thickness, said operating field capable of deflection and having a pressure-sensitive sensor element incorporating an FSR sensor arranged below said operating field comprising the steps of:

applying pressure by application of a user's finger on said operating field resulting in deflecting the operating field;

detecting a change in a signal value as a result of a change in resistance of said FSR sensor;

detecting a second change in the signal value as a result in a second change in resistance of said FSR sensor; and determining that the time duration between said first change and said second change is less than a threshold duration thereby defining a user operation.

18. The method according to claim 17, wherein said threshold duration is less than two seconds.

19. The method according to claim 17, wherein said FSR sensor is used as a variable resistance and is evaluated with a resistance measurement.

20. The method according to claim 19, wherein said FSR sensor is constructed in such a way that a deflection of the operating cover onto the FSR sensor of 10 μm causes the resistance to change by at least a factor of 10.

* * * * *

UNITED STATES PATENT AND TRADEMARK OFFICE
CERTIFICATE OF CORRECTION

PATENT NO. : 7,652,230 B2  Page 1 of 1
APPLICATION NO. : 11/461644
DATED : January 26, 2010
INVENTOR(S) : Martin Baier It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 644 days.

Signed and Sealed this

Twenty-third Day of November, 2010

David J. Kappos
*Director of the United States Patent and Trademark Office*

UNITED STATES PATENT AND TRADEMARK OFFICE
CERTIFICATE OF CORRECTION

PATENT NO.        : 7,652,230 B2                                    Page 1 of 1
APPLICATION NO.   : 11/461644
DATED             : January 26, 2010
INVENTOR(S)       : Martin Baier It is certified that error appears in the above-identified patent and that said Letters Patent is hereby corrected as shown below:

Column 7
Line 5, delete "device"

Column 7
Line 6, delete "comprises"

Column 7
Line 28, "a wherein" should read --wherein--

Signed and Sealed this
Eighteenth Day of January, 2011

David J. Kappos
*Director of the United States Patent and Trademark Office*